United States Patent
Olovsson

(10) Patent No.: US 7,167,816 B1
(45) Date of Patent: Jan. 23, 2007

(54) EULERIAN-LAGRANGIAN MAPPING FOR FINITE ELEMENT ANALYSIS

(75) Inventor: Lars Olovsson, Haninge (SE)

(73) Assignee: Livermore Software Technology Corporation, Livermore, CA (US)

(*) Notice: Subject to any disclaimer, the term of this patent is extended or adjusted under 35 U.S.C. 154(b) by 849 days.

(21) Appl. No.: 10/081,387

(22) Filed: Feb. 22, 2002

(51) Int. Cl.
 *G06F 17/50* (2006.01)
(52) U.S. Cl. .................... 703/1; 703/2; 700/98
(58) Field of Classification Search .......... 703/1, 703/2; 700/98
 See application file for complete search history.

(56) References Cited

U.S. PATENT DOCUMENTS

| | | | |
|---|---|---|---|
| 5,379,227 A | | 1/1995 | Tang et al. |
| 6,295,464 B1 | * | 9/2001 | Metaxas ............... 600/407 |
| 6,353,768 B1 | | 3/2002 | Karafillis et al. |
| 6,560,570 B1 | * | 5/2003 | Dohrmann et al. ......... 703/7 |
| 6,678,642 B1 | * | 1/2004 | Budge ..................... 703/2 |
| 6,785,640 B1 | * | 8/2004 | Lu et al. .................. 703/7 |
| 2002/0077795 A1 | | 6/2002 | Woods et al. |

OTHER PUBLICATIONS

"LS-DYNA Keyword user's manual, Nonlinear Dynamic Analysis of Structures", Livermore Software Technology Corporation, Version 950, May 1999.*
Plimpton et al., "Transient Dynamics Simulations : Parallel algorithms for contact detection and smoothed particle hydrodynamics", IEEE, 1996.*
LS-DYNA News, "An Information Letter for users and applications of LS-DYNA edited by the European LS-DYNA distributor group", Issue 3, Jan. 1999.*
Stoker, "Development of the Arbitrary Lagrangian-Eulerian Method in Non-Linear Solid Mechanics. Application to Forming processes", University of Twente, Feb. 1999.*
Antaki et al., "A parallel dynamic-mesh lagrangian method for simulation of flows with dynamic interfaces", IEEE, 2000.*
FEA Information Co., 3rd Issue, Dec. 9, 2000.*
Benamou, "An Eulerian numerical method for geometric optics", Canum, 2000.*
Guilkey et al., "An implicit time integration strategy for use with the material point method", Elsevier Science Ltd, 2001.*
"LS-DYNA Keyword user's manual, vol. 1", Livermore Software Technology Corporation, Version 960, May 2001.*
FEA Information International News, Issue Mar., 2001.*
USPTO/Office Action issued in U.S. Appl. No.: 09/836,490 mailed Sep. 13, 2004, received Sep. 20, 2004, 15 pages.
LS-DYNA Keyword Users Manual, May 1999, Livermore Software Technology Corporation, Version 950, pp. 1.1-1.12; 7.28-7.29; 18.6-18.9.
ABAQUS/Answers, Spring 1997, Hibbitt, Karlsson & Sorenson, Inc., pp. 1-4.
ABAQUS/Answers, Summer 1999, Hibbitt, Karlsson & Sorenson, Inc., pp. 1-4.

(Continued)

*Primary Examiner*—Albert W. Paladini
(74) *Attorney, Agent, or Firm*—Parsons Hsue & de Runtz LLP

(57) ABSTRACT

A computer system and method for performing a finite element analysis to determine the final dimensions of an object comprising automatically switching from an Eulerian formulation to a Lagrangian formulation during the analysis.

28 Claims, 11 Drawing Sheets

OTHER PUBLICATIONS

M. Feliziani and F. Maradei; "An Explicit-Implicit Solution Scheme to Analyze Fast Transients by Finite Elements," Mar. 1997, IEEE Transactions on Magnetic; vol. 33, No. 2, pp. 1452-1455.

Wang, Choudhry and Wertheimer, "Comparison Between the Static Implicit and Dynamic Explicit Methods for FEM Simulation of Sheet Forming Processes," 1997, pp. 1-6.

T. J. R. Hughes, *The Finite Element Method: Linear Static and Dynamic Finite Analysis*; Dover Publications, Prentice- Hall, 1987, 2000, pp. iii-682.

USPTO Office Action mailed in U.S. Appl. No. 10/271,931 on Jan. 11, 2006, 17 pages.

Maker, "Implicit Springback Calculation Using LS-DYNA," Livermore Software Calculation Using LSDYNA, 5th International LS-DYNA Users Conference, Sep. 21-22, 1998, 1 page.

* cited by examiner

Tip of beam before projection          Tip of beam after projection

FIG. 10b                                         FIG. 10c

EULERIAN-LAGRANGIAN MAPPING FOR FINITE ELEMENT ANALYSIS

CROSS REFERENCE TO RELATED APPLICATIONS

This application is related to U.S. patent application Ser. No. 09/836,490 filed Apr. 17, 2001 entitled "Implicit-Explicit Switching for Finite Element Analysis", which is hereby incorporated by reference in its entirety.

BACKGROUND OF THE INVENTION

1. Field of the Invention

The present invention relates generally to computer simulations using the finite element method, and more specifically, to a method for switching from an explicit Eulerian formulation to an implicit Lagrangian formulation in a finite element simulation of motion.

2. Related Art

The finite element method is a technique for obtaining approximate numerical solutions to boundary value problems which predict the response of physical systems subjected to external loads. The finite element method is described in detail by Thomas J. R. Hughes in "The Finite Element Method" (1987), published by Prentice-Hall, Inc., New Jersey, which is incorporated herein by this reference in its entirety. One common use of the finite element method is in the field of solid mechanics where it is used to analyze structural problems such as the formation of stamped sheet metal parts or the springback of stamped sheet metal parts. Another common application is injection molding. The equations describing the physical event of interest are generally overly complex to be solved exactly.

The finite element method is a technique where the geometry of the analysed structure is approximated as a set of points in space. The points, which are referred to as nodes, are connected together to form finite elements. This process is referred to as discretization. FIG. 1 shows the discretization of a wrench. The discretization of the geometry allows the differential equations to be approximated as finite sized matrix equations.

The finite element method can be used to run two or three dimensional simulations. In a two-dimensional (2D) simulation the elements are areas. In a three-dimensional (3D) simulation the elements are volumes. All of the simulations illustrated in this example are 3D simulations. The elements are therefore three dimensional volumes. However, for ease of illustration and explanation cross sections are used to illustrate the invention. The fill fraction, which in these 3D simulations is referred to as the volume fraction, would be an area fraction in the case of a 2D simulation. The elements and nodes form a mesh or grid, and these terms are used interchangeably throughout this application. Additionally, the elements are shown as cubes or rectangles, however other geometric shapes may be used.

In structural mechanics, the matrix equations describe the relationship between the stress and velocity fields and the acceleration field at a specific instant in time. To follow the deformation process, one needs to integrate the matrix equations in time. Due to non-linearities, an exact integration is generally not possible. A time discretization is necessary and one usually relies on a finite difference scheme to drive the solution forward in time. The matrix equations may be explicitly or implicitly integrated. Further explanation of explicit and implicit integration can be found in U.S. patent application Ser. No. 09/836,490 filed Apr. 17, 2001 entitled "Implicit-Explicit Switching for Finite Element Analysis", which is hereby incorporated by reference in its entirety.

The finite element method has been implemented in finite element software, such as LS-DYNA, a commercial finite element analysis program developed by Livermore Software Technology Corporation of Livermore, Calif.

I. Explicit Eulerian Material and Void Formulation

An Eulerian finite element formulation is a method where the element grid is fixed in space. The material flows through the grid of elements. The material and void formulation refers to a special method where the elements are not necessarily filled with material. Each element contains a certain volume fraction(3D) or area fraction (2D) of material, ranging from 0 to 1.

Explicit time integration is suitable in situations where there are large non-linearities. No equation systems need to be solved and each time increment is computationally inexpensive. Small time increments are required in order to avoid numerical instabilities and diverging solutions. Explicit time integration techniques are well known in the art.

The sequence of pictures in FIG. 2 are snapshots from an Eulerian material and void simulation. It is a model of a high-speed impact where a piece of falling steel hits a rigid wall. The dark area indicates the location of the material. The steel plastically deforms upon impact. The first box shows the steel block just before impact, the middle box during impact, and the third box after impact has occurred. Observe that the element grid is fixed in space as the steel material flows.

An advantage of the Eulerian formulation is that there are no element distortions. Distorted elements are bad for the numerical accuracy and can even lead to crashing simulations.

A disadvantage is that the flux of material between elements (fixed in space) slows down the simulation and is bad for numerical accuracy. Another disadvantage is that the need for stability in the explicit time integration scheme puts a limit on the maximum allowed time step size. Therefore, slow and quasi-static processes, such as springback, are better treated with implicit methods.

II. Implicit Lagrangian Formulation

A Lagrangian Finite Element formulation is a method where the element grid follows the material flow. That is, each element represents the same piece of material throughout the complete simulation. FIG. 3 shows how the Lagrangian element grid follows the material flow.

Implicit time integration is suitable in static, quasi-static and in certain slow, dynamic simulations. An equation system needs to be solved for each time increment. Implicit time integration techniques are well known in the art.

An advantage of the Lagrangian formulation is that the numerical implementation is relatively straightforward. The numerical accuracy is good at small deformations. Another advantage is that certain implicit time integration schemes provide an unconditional stability. Therefore, large time steps can be allowed in quasi-static simulations.

A disadvantage of the Lagrangian formulation is that element distortions cause numerical problems when dealing with large deformations. Further, solving complex equation systems makes each time step rather costly in terms of time and computing resources.

SUMMARY OF THE INVENTION

The present invention includes a method that overcomes the disadvantages of conventional finite element simulations. The method accomplishes this by switching from an Eulerian to a Lagrangian formulation during a finite element simulation. The material and void based Eulerian formulation is suitable for the study of mechanical processes involving large deformations. An implicit Lagrangian formulation is preferable for the treatment of quasi-static and small deformation processes.

Some events are better described with a mix of the two formulations. For example, many forging and injection molding processes involve large deformations requiring an Eulerian formulation. However, a subsequent cooling down and springback process is better treated with an implicit Lagrangian formulation because the springback is a relatively small deformation in comparison with the initial forging or injection molding process. This can be realized by first simulating the forging or molding operation with an Eulerian simulation. Then, the resulting Eulerian mesh is mapped onto a new Lagrangian mesh and the springback and cooling down process is analyzed with an implicit Lagrangian formulation.

In one embodiment of the present invention, a method for performing a finite element simulation is disclosed. The method includes switching from an Eulerian formulation to a Lagrangian formulation during a finite element simulation.

In another embodiment of the present invention, a computer readable storage medium storing one or more computer programs for performing a finite element simulation is disclosed. The computer programs include instructions for automatically switching between an Eulerian formulation and a Lagrangian formulation during the finite element simulation.

In another embodiment of the present invention, a computer system is disclosed. The computer system includes one or more computers and one or more computer programs running on the computers where the computer programs are for performing a finite element simulation. The computer programs include computer instructions for automatically switching between an Eulerian formulation and a Lagrangian formulation during the finite element simulation.

In another embodiment of the present invention, a data signal embodied in a carrier wave is disclosed. The data signal includes one or more computer programs for performing a finite element simulation. The computer programs include instructions for automatically switching between an Eulerian formulation and a Lagrangian formulation during the finite element simulation.

Other embodiments, aspects, and advantages of the present invention will become apparent from the following descriptions, the accompanying drawings, and the accompanying claims.

BRIEF DESCRIPTION OF THE DRAWINGS

For a more complete understanding of the present invention and for further features and advantages, reference is now made to the following description taken in conjunction with the accompanying drawings, in which:

FIGS. 10a–10c illustrate the process of orthogonal projection of nodes to the material surface according to an embodiment of the present invention.

DETAILED DESCRIPTION OF THE INVENTION

The preferred embodiments of the present invention and their advantages are best understood by referring to FIGS. 1 through 5 of the drawings. Like numerals are used for like and corresponding parts of the various drawings.

System Overview

Figure 1:
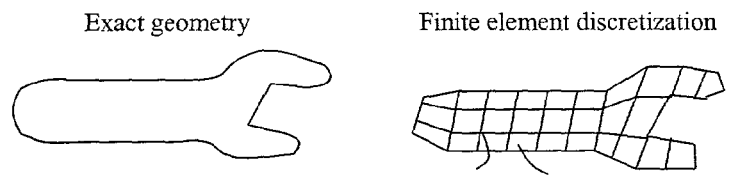
FIG. 1 illustrates the exact geometry and finite element discretization of a wrench.
Figure 2:
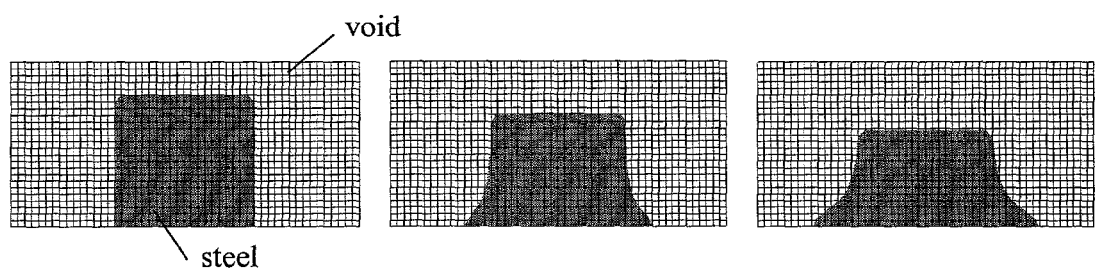
FIG. 2 illustrates an Eulerian simulation of a high speed impact of a steel object impacting a rigid wall and the resultant deformation.
Figure 3:
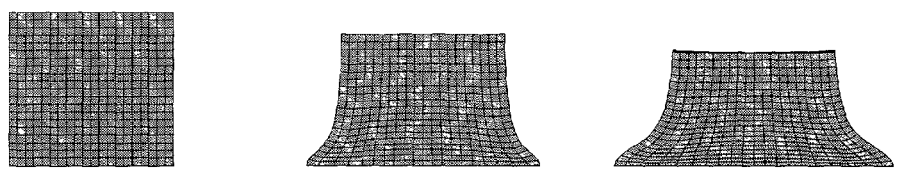
FIG. 3 illustrates a Lagrangian simulation of a high speed impact of a steel object impacting a rigid wall and the resultant deformation.
Figure 4:
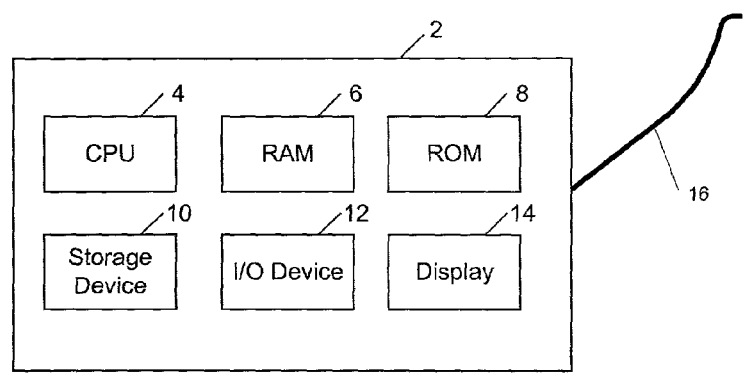
FIG. 4 is a block diagram of an exemplary computer system upon which the methods of the present invention can be performed, according to an embodiment of the present invention.

FIG. 4 is a block diagram of an exemplary computer system 2 upon which the methods of the present invention can be performed, according to an embodiment of the present invention. Computer system 2 can include one or more suitable processing facilities such as microcomputers/workstations, minicomputers, mainframes, and/or massively parallel processing computers running suitable operating systems. Examples of suitable microcomputers/workstations include the IBM PC from IBM Corporation of Armonk, N.Y., and the Sparc-Station from Sun Microsystems Corporation of Mountain View, Calif. Examples of suitable minicomputers are the VAX 750 from Digital Equipment Corporation of Maynard, Mass. and the AS/400 from IBM. An example of a suitable mainframe is the System-390 series from IBM. Examples of suitable massively parallel processing computers include the Cray T3E or the Cray T90 from Cray Corporation of Mendota Heights, Minn. Examples of suitable operating systems include any of the various versions of Unix, VMS from Digital Equipment, or OS/2 from IBM. Computer systems used in the development of the invention include the IBM RS-6000, the Hewlett-Packard V-Class, and the Silicon Graphics Origin 2000, all of which are engineering workstations or servers running under the UNIX operating system, as ported by each hardware vendor. Those skilled in the art will recognize that other types of suitable computer systems and suitable operating systems can be used in accordance with the present invention.

Computer system 2 includes the following components: a central processing unit (CPU) 4, a random access memory (RAM) 6, a read-only memory (ROM) 8, a storage device 110, an input/output (I/O) device 12, display 14, and network connection 16. Although only a single instance of each component is shown, it should be recognized that computer system 2 can include one or more of any of the components shown in FIG. 4. Computer system 2 can also include other suitable computer components. For clarity, interconnections between the various components of computer system 2 are not shown. Additionally, multiple computers 2 can be connected via network connection 16, either through a local area network (LAN) or through a larger network such as the internet. A computer "farm" may be configured wherein each computer system 2 or CPU 4 calculates a portion of the simulation. The portions are then later integrated to arrive at the complete simulation. In some cases, this networked "farm" may be more efficient than using one more powerful computer such as a workstation or mainframe.

CPU 4 can be any type of processor, such as a Pentium processor from Intel Corporation or an Alpha EV5 from Digital Equipment Corporation, used to process information in computer system 2.

RAM 6 can be any type of memory device, including dynamic and/or static RAM, used to store any number of different types of information required by computer system 2. For example, RAM 6 can store computer programs for performing the method of the present invention.

ROM 8 can be any type of read-only memory device, including PROMs, EPROMs and EEPROMs, used to store any number of different types of information required by computer system 2. For example, ROM 8 can store information concerning initialization routines or even some or all of the computer programs for performing the method of the present invention.

Storage device 10 can be any type of mass storage device, including magnetic, electrical, and optical-type storage devices, used to store any number of different types of information required by computer system 2. For example, storage device 10 can store various types of data or even some or all of the computer programs for performing the method of the present invention. The computer programs may be transmitted over network connection 16 as a data signal.

I/O device 12 can be any type of input/output device, including keyboards, printers, or any other type of device, by which information can be entered into or received from computer system 2.

Display 14 can be any type of display device, including those of the CRT and flat-panel display type, used to display information. For example, display 14 can display the results of a computer simulation, which results from performing the methods of the present invention, via a graphical user interface.

Eulerian and Lagrangian Phases

A finite element analysis according to an embodiment of the invention is split into two phases. The Eulerian and Lagrangian phase can be implicit or explicit. For illustrative purposes an explicit Eulerian phase and an implicit Lagrangian phase are described. The explicit Eulerian phase is described by the flow diagram in FIG. 5 and the implicit Lagrangian phase is described by the flow diagram in FIG. 8.

There are two main steps in the switching from the Eulerian material and void formulation to the Lagrangian formulation. First, a new mesh is automatically created, and then the results are mapped from the Eulerian mesh onto a Lagrangian mesh.

Explicit Eulerian Phase

Figure 5:
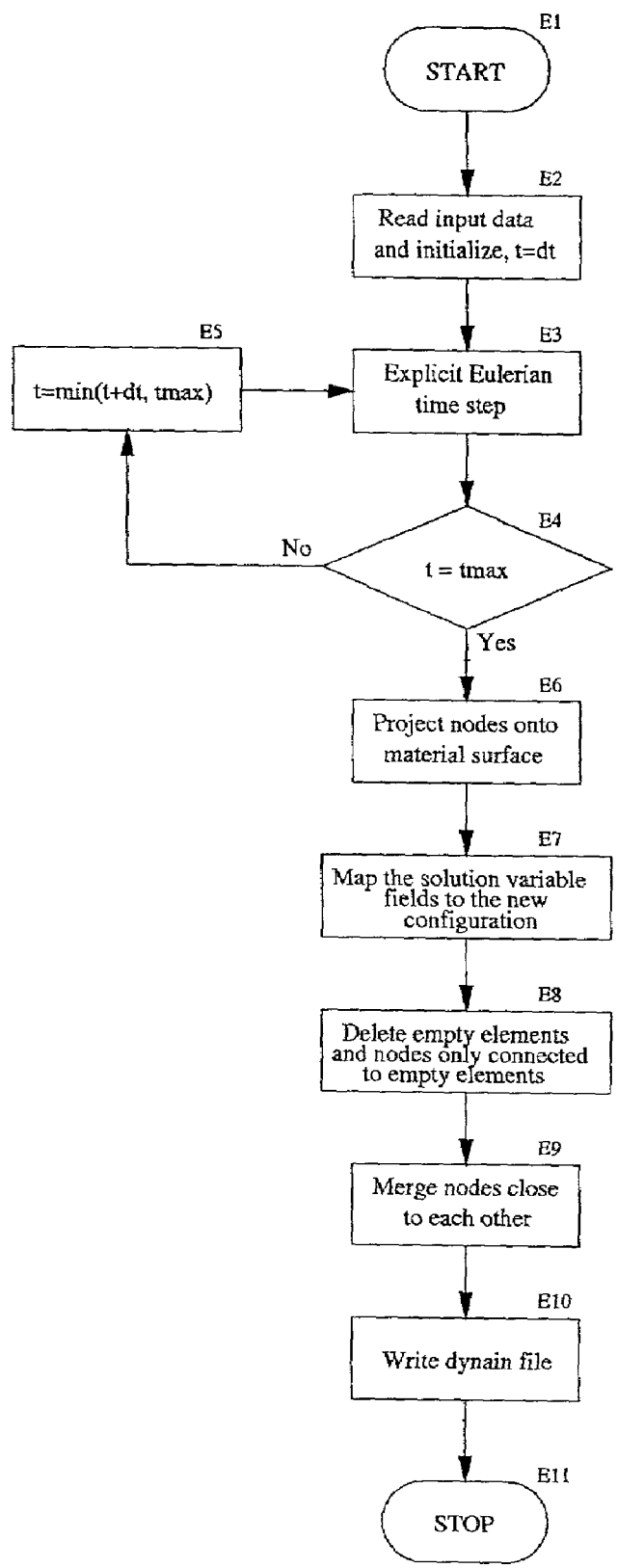
FIG. 5 is a flowchart of an exemplary explicit Eulerian simulation and mapping of a new mesh according to the first phase of an embodiment of the present invention.

Referring to the flow chart of FIG. 5, the explicit Eulerian phase is described.

First, in step E1, the simulation program (LS-DYNA) is started. Then in step E2, information describing the process to be analysed is read from the storage device 10 of computer system 2. A suitable time step size, dt, is computed and the current time is set to t=dt.

Figure 6:
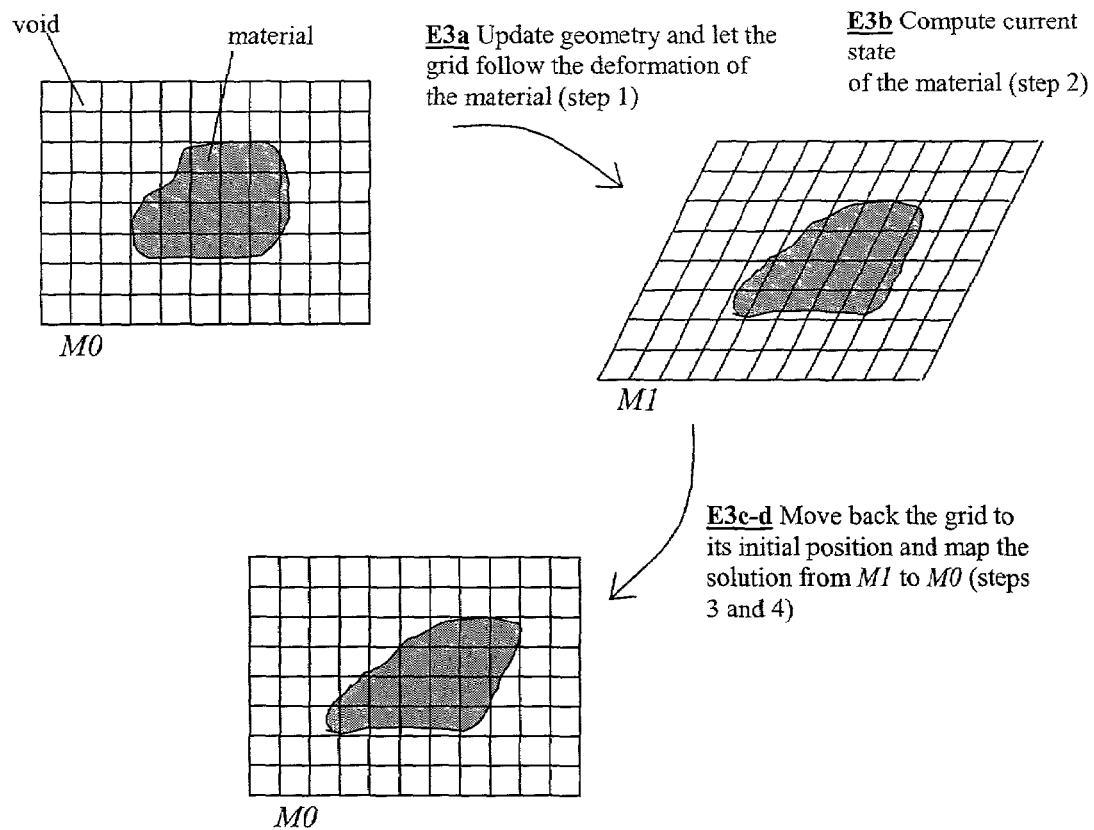
FIG. 6 is an exemplary illustration of an explicit Eulerian time step E3 of FIG. 5 broken down into individual steps.

In step E3 an explicit Eulerian time step is taken. Step three is illustrated in further detail in FIG. 6. In step E3$a$, the velocity field and the geometry at the current time, t, are computed. Note that the nodes follow the motion of the material (mesh configuration M1). In step E3$b$, the incremental deformation of the structure is computed and the current state of the material is estimated. In steps E3$c$–$d$, the nodes are moved back to their initial position (mesh configuration M0), and the solution is mapped from mesh configuration M1 to mesh configuration M0. This process is well known in the art.

Referring once again to FIG. 5, in step E4, the system will check if the termination time, tmax, has been reached. If it has been reached, the process will continue on to step E6. If it has not been reached, the system will update the time, t, for a new time step increment in step E5, and continue on until time tmax has been reached. The time tmax is a the overall time allotted for a simulation or part of a simulation, and is user selectable. In this instance, it is the time at which the Eulerian portion of the simulation will terminate, i.e., when no more Eulerian time steps will be performed. When the user sets up the simulation, he will decide at which point in time he wishes to conclude the Eulerian portion of the simulation. Alternatively this may be preset in the software for certain simulations.

Figure 7:
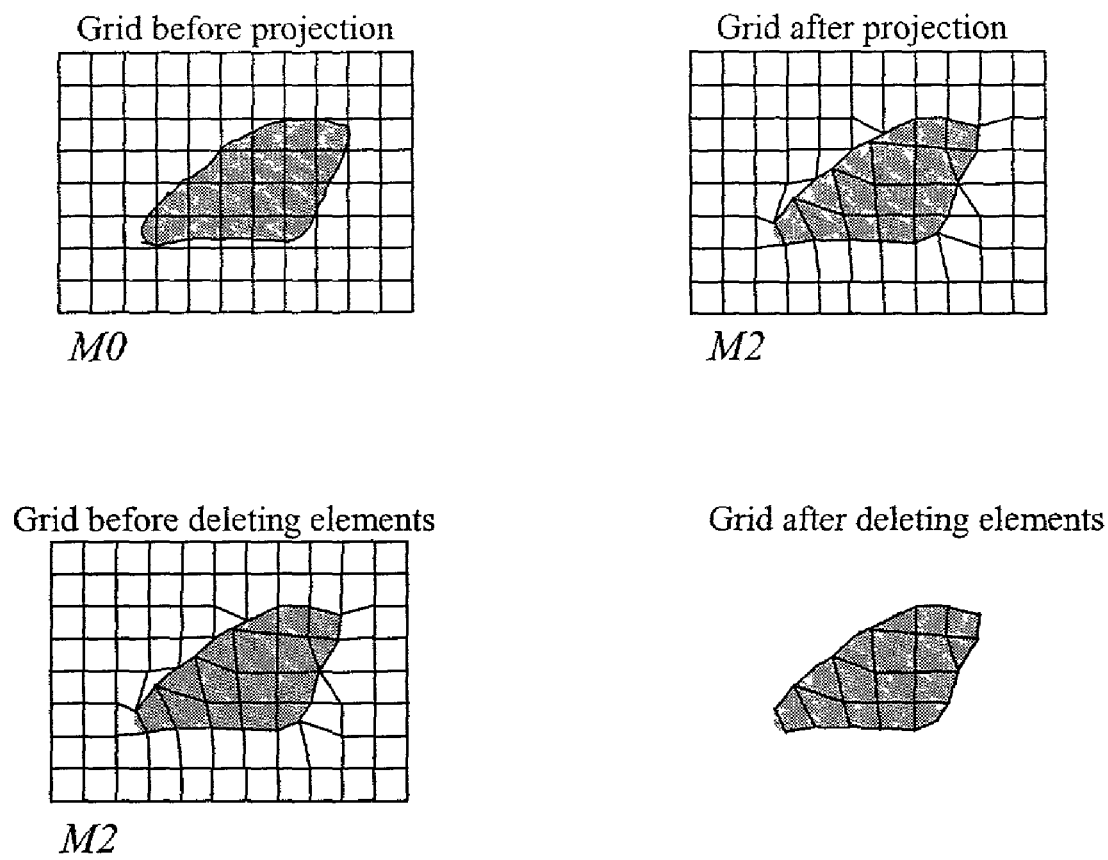
FIG. 7 is an exemplary illustration of steps E6–E8 of FIG. 5.

Steps E6–E8 are illustrated in further detail in FIG. 7. In step E6, the system will sort out partially filled elements that are cut by the material surface. FIG. 7 illustrates a two dimensional cross section of a material. The material is represented by the dark object. The outer boundary, as seen in the cross section of the material, is referred to as the surface of the material in this 3D simulation. The person performing the simulation will decide what cross section and thus boundary to analyze in a two dimensional simulation or what surface to analyze in a three dimensional simulation. Some nodes of partially filled elements are projected orthogonally down to the material surface, and some nodes are projected up to the material surface. Partially filled elements are treated differently depending on their fill fraction, $\eta$.

The threshold fill fraction $\eta$ will be used to determine which nodes of an element are mapped to the surface. This value can range from about 0.5 to 1.0 and is preferably 0.7. An obvious transition between outwards and inwards projection of nodes would be at 1=0.5. However, the inwards projection creates smaller elements and potentially troublesome element distortions. A transition at $\eta$=0.7 has proven to generate more well shaped elements, which is important for the condition number of the subsequently formed stiffness matrix. The new mesh configuration is referred to as M2.

If the fill fraction $\eta$ is greater than 0.7, then nodes outside the material domain are projected orthogonally down to the material surface. Nodes inside the material domain are not moved.

If the fill fraction $\eta$ is less than or equal to 0.7, then nodes inside the material domain are projected orthogonally outwards to the material surface. Nodes outside the material domain are not moved.

In step E7 the standard Eulerian mapping algorithm is used to map the solution from configuration M0 to configuration M2 i.e. the nodes are connected to form the mesh. Frequently applied mapping methods are the Donor Cell and the van Leer algorithms, which are well known in the art.

In step E8 any empty elements, that is, elements with a fill fraction $\eta=0$, are deleted from the grid.

Referring once again to FIG. 5, in step E9, closely spaced nodes are merged. Different nodes might be projected to almost the same point on the material surface, and some brick (orthogonal Eulerian grid) elements degenerate to 4, 5, 6 or 7 node elements. Nodes located a small distance from each other are merged according to the following formula:

$$d < 0.2 \ V\sqrt[3]{V} \Rightarrow \text{merge nodes,}$$

where d is the distance between two adjacent nodes in one element and V is the element volume.

In step E10 information about the current mesh, the material state and the velocity field are saved to the file dynain on the storage device 10 of the system 2 shown in FIG. 4. This information will be used during initialization of the subsequent implicit Lagrangian simulation phase.

Finally in step E11, the Eulerian phase of the simulation is terminated.

Implicit Lagrangian Phase

Figure 8:
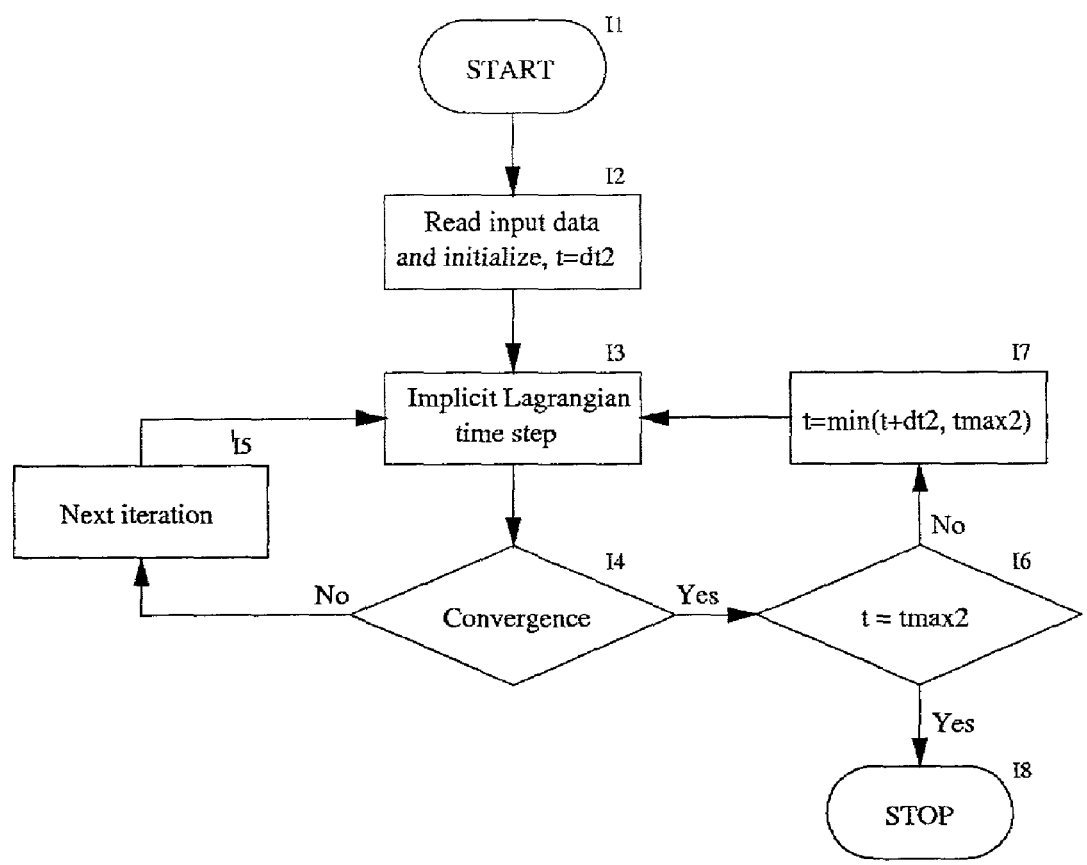
FIG. 8 is a flowchart of an exemplary implicit Lagrangian simulation according to a second phase of an embodiment of the present invention.

Referring to FIG. 8, the implicit Lagrangian phase of the simulation program is started in step I1. In step I2, information describing the process to be analysed is read from the storage device 10. Initial stresses and the geometry are defined by the data in the file dynain. The time step size, dt2, is user defined and the current time is set to t=dt2. The variable indicating the equilibrium iteration number is set to iter=1.

In step I3 an implicit Lagrangian time step is taken. The deformation and velocity fields at time t are predicted. The material state, based upon the predicted deformation, is estimated. The predicted state at the iteration is denoted as $S_{iter}$.

In step I4 the system determines if equilibrium is satisfied for the predicted deformation and material state, i.e., if there is convergence of the mathematical solution.

If too far away from equilibrium, another iteration will be prepared as seen in step I5 (set iter:=iter+1) and another implicit Lagrangian time step will be taken in step I3 until convergence has been achieved.

Once convergence has been achieved, the system will proceed to step I6. In step I6 the system checks if the termination time, tmax2, has been reached. If tmax2 has not been reached the system will update the time, t, in step I7, for a new time step increment, set the iteration value to 1 (set iter=1), and return to step I3 where it will perform another implicit Lagrangian time step. The time tmax2 is the maximum time for the Lagrangian portion of the simulation, and is selectable by the user when configuring the simulation. Generally it would be set to a time when adequate springback has already occurred. Alternatively, tmax2 can be selected by the system. If tmax2 has been reached, the simulation will be stopped in step I8.

Illustrative Example

Figure 9:
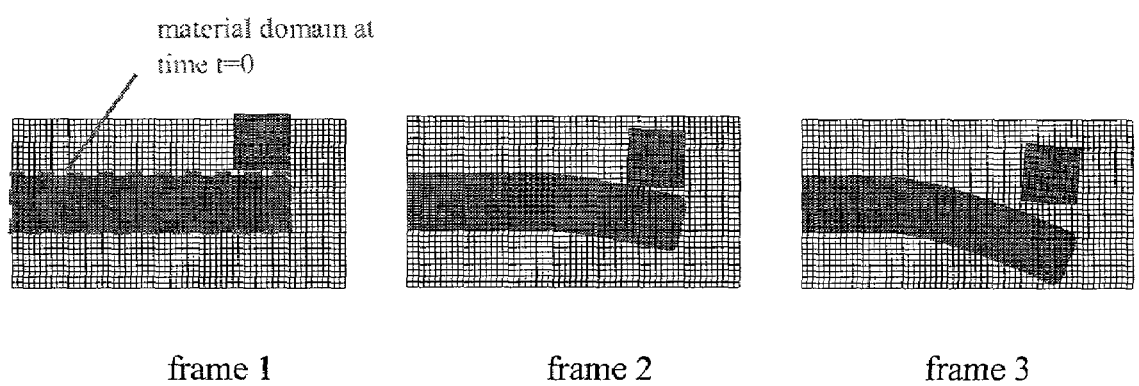
FIG. 9 illustrates a simulation of a box impacting a beam.

A simple application of the invention is presented below in FIGS. 9–11 to illustrate operation of the invention. A box impacts a cantilever beam, which is subsequently elastically deformed and returns back to its initial state. This example is used to illustrate the concepts of the invention in a simple application. In this elastic deformation, the springback is in theory equal to the initial deformation. However, the method of the present invention is generally tailored for applications such as metal stamping or injection molding, where the initial deformation is substantially plastic and quite large in comparison to the subsequent springback. In these applications, the final dimensions of the finished product after springback are critical to the manufacturer and end user. It is in these cases that using a combination of the Eulerian and Lagrangian methods is most advantageous, and leads to a more accurate prediction of dimensions than prior systems.

An Eulerian simulation is first performed. The impact event is simulated dynamically with an explicit time integration for a short period of time, as seen in FIG. 9. The first frame of FIG. 9 captures the instant the falling box makes contact with the beam (time t=0). In the second and third frames, the beam has been deflected by the impact. The third frame shows the maximum deflection of the beam.

At the maximum deflection point, which is determined by the user, a Lagrangian model of the beam is created and a quasi-static implicit springback simulation is performed. Different steps of the process are presented in FIGS. 10a–c and 11.

Figure 10A:
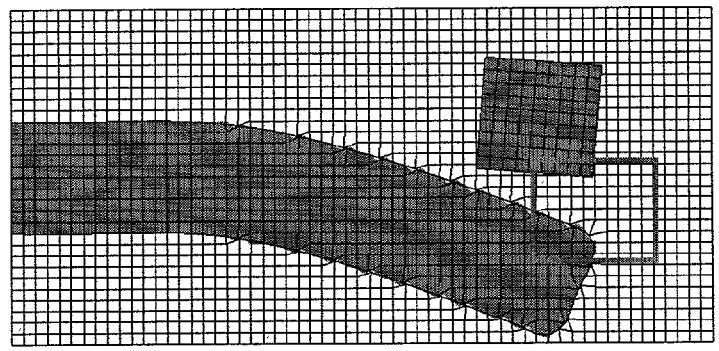
Figure 11:
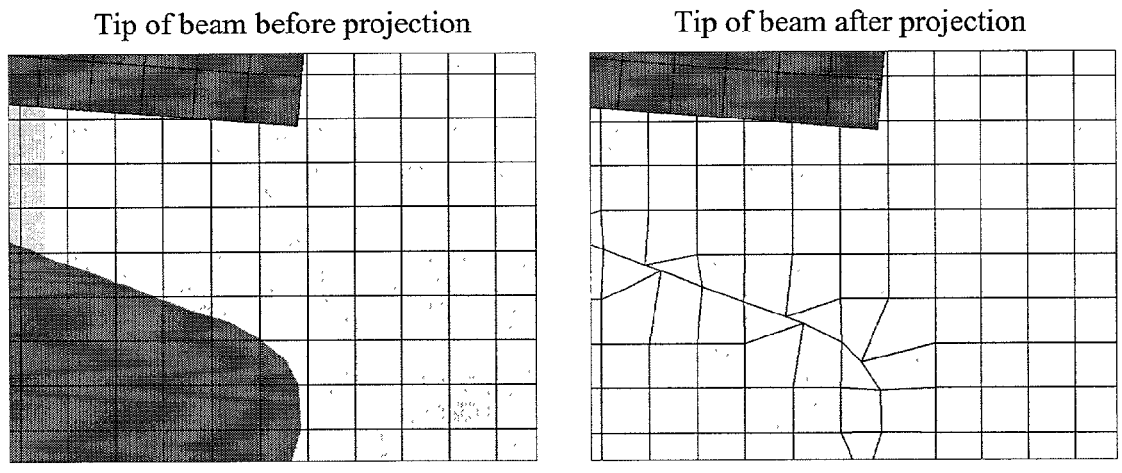
FIG. 11 illustrates the beam of FIGS. 9 and 10a–10c after removing empty cells according to an embodiment of the present invention.
Figure 11:
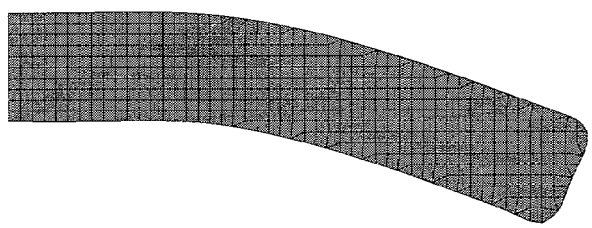

FIG. 10a shows the beam at its maximum deflection and a box around the tip of the beam which is enlarged in FIGS. 10b and 10c. FIG. 10b shows the tip of the beam before projection of the nodes to the surface of the beam. As discussed above the nodes outside the surface of the beam will either be projected down to the surface or the nodes inside the beam will be projected out the surface of the beam depending on the fill fraction 11 of the associated element. FIG. 10c shows the tip of the beam after the nodes have been projected to the surface of the beam. FIG. 11 shows the beam after removing the empty cells, i.e., those cells having a fill fraction $\eta=0$.

Figure 12:
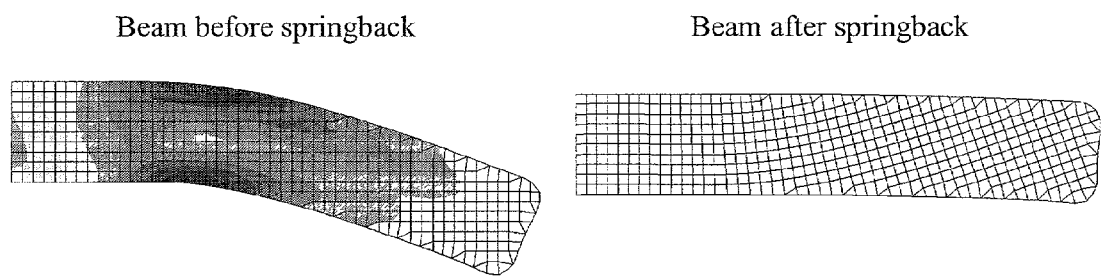
FIG. 12 illustrates the beam of FIGS. 9–11 before and after springback.

FIG. 12 shows the subsequent implicit springback analysis. On the left, FIG. 12 shows the beam before springback including the fringe of Von Misses stresses. On the right, FIG. 12 shows the beam after a simulated springback using the newly mapped grid and a Lagrangian analysis according to the invention as described previously. Note that the beam is not completely straight as a result of deficiencies in the previously described mapping process at the material boundaries. These deficiencies are minimized by minimizing the movement of the nodes and elements. Only elements in the vicinity of the material boundary are moved when creating the Lagrangian mesh. This is important for the numerical accuracy in the process of mapping the solution from the Eulerian mesh onto the Lagrangian one. In fact, in the interior of the body, where no elements are moved, the mapping will be exact and no information will be lost.

If the Eulerian and Lagrangian simulations were perfectly accurate, in this example of elastic deformation the beam would be precisely as it was before any deformation. In this example, the initial deformation was designed to be completely elastic and thus the springback was of an equal magnitude to the deformation. However, where the initial plastic deformation is of relatively large magnitude when compared to the subsequent springback, as is the case in such applications as stamping and molding, using the Eulerian formulation for the large deformation and the implicit Lagrangian formulation for the springback results in a more tailored and accurate simulation than is otherwise possible with prior solutions.

FIGS. 13a–13d illustrate another application of the invention.

Figure 13A:
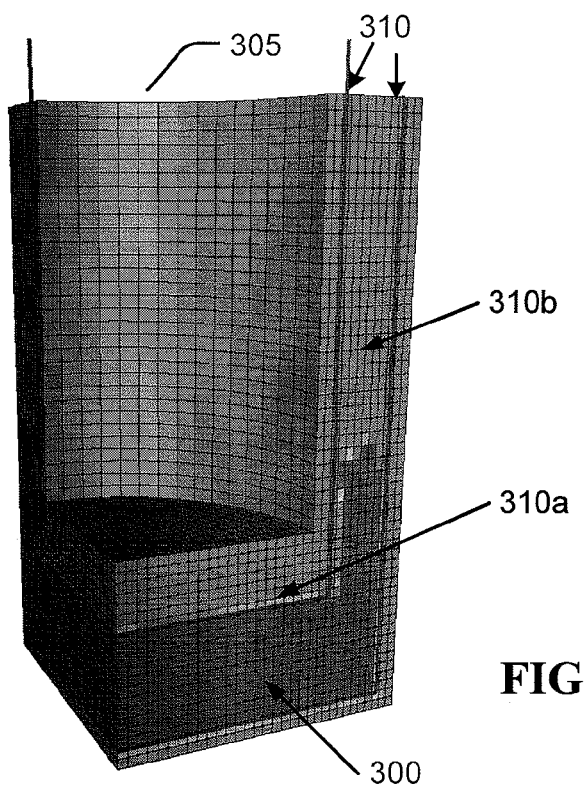
FIGS. 13a–d illustrate a simulation of the forging process of a cup utilizing the present invention.

Referring to FIG. 13a, a thick cylindrical disk of material is to be formed into a cylindrical cup using a forging process.

FIG. 13a shows the disk material 300 inside a larger computational domain 305 which is initially void. The outline of the forging tool 310 is shown in each FIGS. 13a–13d. The bottom surface 310a of the forging tool 310, which may be the bottom of a piston in some applications moves down to force the material up through the side cavity 310b of the forging tool 310. Only one quarter of this axisymmetric model is shown. In this Eulerian phase of the simulation note that the grid and its elements are fixed and the material moves through the fixed grid.

As the forging begins, the bottom surface 310a advances downward, causing the disk material 300 to extrude upward into the cavity 310b between the sides of tool 310. This extruded disk material elongates as the tool advances, forming the sides of the cylindrical cup. This progression can be seen from FIG. 13a to FIG. 13b.

Figure 13B:
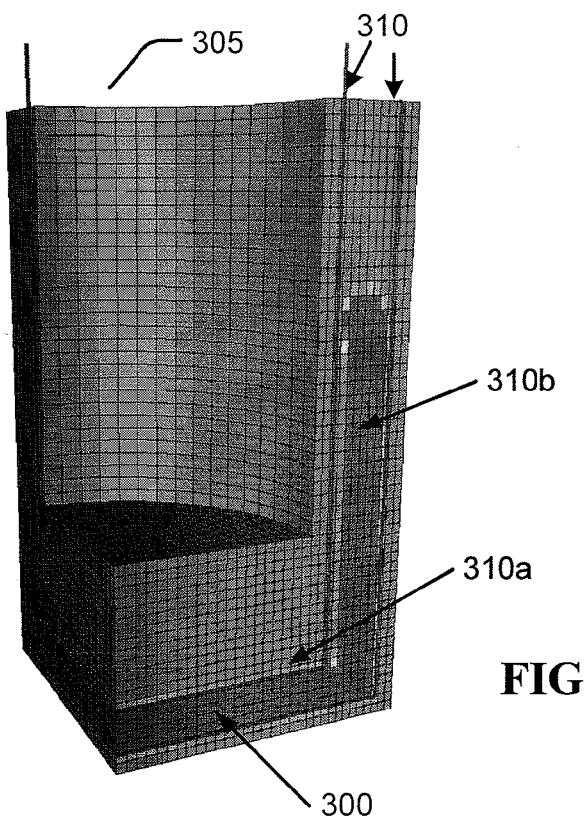
Figure 13C:
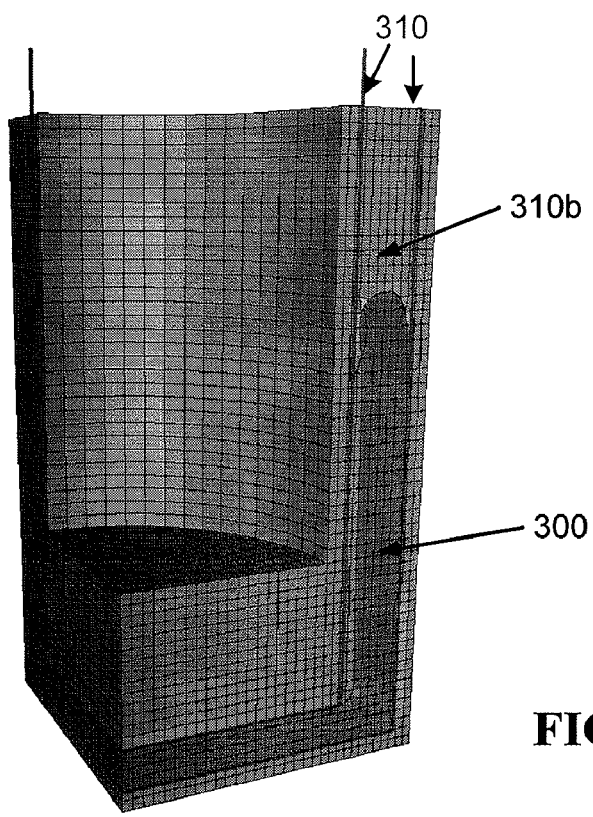

In FIG. 13c, after the forging finishes, the nodes are mapped onto the boundary or surface of the disk material (the cup).

Figure 13D:
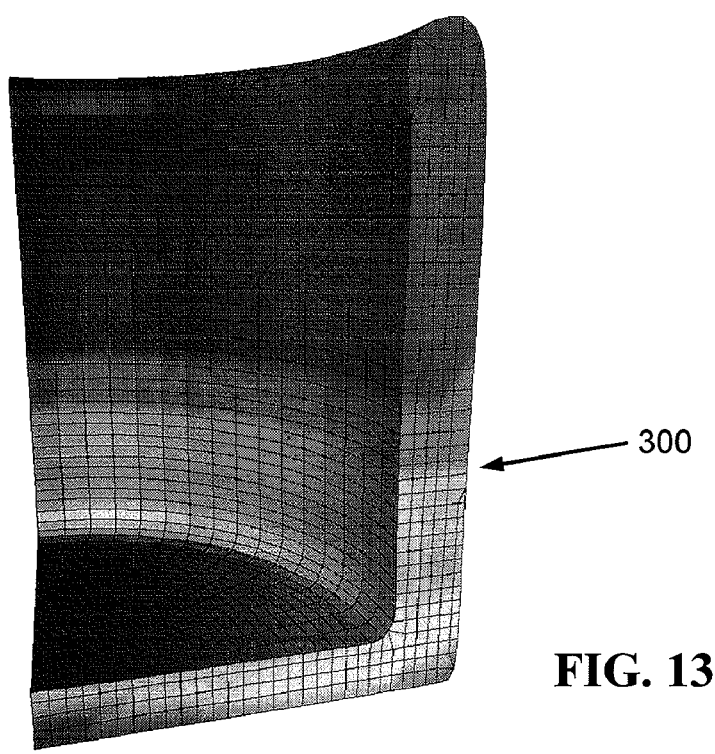

FIG. 13d illustrates the cup formed from disk material 300. The final dimensions of the cup are automatically and accurately simulated with the present invention. The internal stresses from the forming process shown in FIGS. 13a–b are used to determine the subsequent springback of the material, so that the final and accurate dimensions of the cup are simulated. The present invention performs all of this automatically, thus providing the engineer running the simulation a powerful, effective, and very convenient tool.

Different numerical solution procedures are preferable in different situations. The modeling of certain mechanical processes can not be treated efficiently with one solution procedure solely. The invention allows a switching between methods and a wider range of mechanical processes can now be analysed. The automatic Eulerian-Lagrangian switching method is a robust automatic procedure that can obtain solutions which are very accurate and can be obtained with minimal operator interaction. Conventional simulation techniques often could not produce an accurate solution and required significant operator interaction.

While particular embodiments of the present invention and their advantages have been shown and described, it should be understood that various changes, substitutions, and alterations can be made therein without departing from the spirit and scope of the invention as defined by the appended claims. For example, although it has been described how the present invention can be used in formation simulations and springback simulations, those skilled in the art will recognize that the present invention can be applied to a wide variety of problems relating to non-linear static or dynamic analysis using the finite element method, such as general structural mechanics and stress analysis, fluid mechanics, biomechanics, heat transfer, geomechanics, aeromechanics, chemical reactions, acoustics, and electric and magnetic fields. In addition, an explicit Eulerian and an implicit Lagrangian method have been illustrated; however, the Eulerian and Lagrangian methods can be either implicit or explicit.

What is claimed is:

1. A method for performing a finite element analysis comprising:
   performing a Eulerian simulation, wherein a grid having nodes forming elements is superimposed with a material having a surface; and thereafter
   projecting the nodes onto the surface of the material; and thereafter
   mapping a set of solution variable fields to the material with an Eulerian mapping algorithm; and thereafter
   performing a Lagrangian simulation.

2. The method of claim 1, further comprising deleting empty elements and the nodes only connected to empty elements.

3. The method of claim 1, wherein each element has a fill fraction, and wherein a node within the material surface is projected to the surface if the fill fraction is less than 0.7, and wherein a node without the material surface is projected to the surface if the fill fraction is in the range of about 0.5 to 0.8.

4. The method of claim 1, wherein the Eulerian simulation is explicitly integrated and wherein the Lagrangian simulation is implicitly integrated.

5. The method of claim 1, further comprising merging selected nodes together after projecting the nodes onto the surface.

6. An automated method of determining the final dimensions of a formed object comprising:
   determining the dimensions of the object at first state after a forming operation with an explicit Eulerian based finite element simulation; and
   determining the dimensions of the object at a final state after the forming operation by running an implicit Lagrangian based finite element simulation using the results of the Eulerian based simulation, the results comprising the dimensions at the first state.

7. The method of claim 6, further comprising converting the results of the Eulerian simulation into a Lagrangian mesh before performing the Lagrangian simulation.

8. The method of claim 7, wherein converting comprises projecting the nodes of the mesh onto a surface of the object.

9. An automated method of performing a finite element simulation comprising:
   performing a first phase of the simulation using an Eulerian method to determine the dimensions of an object after an initial deformation, wherein an Eulerian element grid is formed;
   mapping the solution from the Eulerian element grid of the first phase onto a Lagrangian element grid; and thereafter
   performing a second phase of the simulation using a Lagrangian method to determine the dimensions after shrinkage or springback of the object from the initial deformation.

10. The method of claim 9, wherein the Eulerian element grid is mapped to the Lagrangian element grid using Eulerian mapping algorithms.

11. The method of claim 10, further comprising:
   projecting nodes adjacent to the surface of the object to the surface of the object; and
   merging certain of the nodes together.

12. A computer readable storage medium storing one or more computer programs for performing a finite element simulation of a material, the computer programs comprising instructions for automatically switching from a Eulerian simulation of an initial deformation to a Lagrangian simulation of a subsequent deformation during the finite element simulation.

13. The computer readable storage medium of claim 12, wherein the subsequent deformation is a springback type deformation resulting from residual energy within the material.

14. The computer readable storage medium of claim 12, wherein the computer programs further comprise computer instructions for projecting nodes of the Eulerian simulation to the surfaces of the material.

15. The computer readable storage medium of claim 14, wherein the computer programs further comprise computer instructions for automatically mapping the solution variable fields of the Eulerian simulation after projection of the nodes.

16. The computer readable storage medium of claim 12, wherein the computer programs further comprise computer instructions for merging adjacent nodes of the Eulerian simulation.

17. The computer readable storage medium of claim 14, wherein the computer instructions include instructions for projecting nodes of elements within the material to the surface if the element is less than 70 percent full, and for projecting nodes without the material to the surface if the element is 70 percent or more full.

18. A computer system comprising:
one or more computers; and
one or more computer programs running on the computer(s), the computer programs for performing a finite element simulation of a material comprising a first explicit Eulerian simulation step and a second implicit Lagrangian simulation step, the computer programs comprising computer instructions for automatically switching from the explicit Eulerian simulation step to the implicit Lagrangian simulation step during the finite element simulation.

19. The computer system of claim 18, wherein the computer programs further comprise computer instructions for converting the grid and the solution variable fields formed during the first Eulerian step into a grid and solution variable fields for use in the second Lagrangian step.

20. The computer system of claim 19, wherein the instructions for converting the grid and solution variable fields include instructions for projecting the nodes of elements of the grid onto a surface of the material.

21. The computer system of claim 19, wherein the instructions for converting the grid include instructions for merging selected nodes together.

22. A data signal embodied in a carrier wave, the data signal including one or more computer programs for performing a finite element simulation, the computer programs comprising instructions for automatically switching between a Eulerian formulation and a Lagrangian formulation during the finite element simulation.

23. The data signal embodied in a carrier wave of claim 22, wherein the computer programs further comprise computer instructions for beginning the finite element simulation using the Eulerian formulation.

24. The data signal embodied in a carrier wave of claim 22, wherein the computer programs further comprise computer instructions for converting the results and mesh of the Eulerian formulation into results and mesh usable for the Lagrangian formulation.

25. A method for performing a finite element analysis, the method comprising automatically switching from an Eulerian formulation to a Lagrangian formulation during the analysis.

26. The method of claim 25, wherein the Eulerian method is explicitly integrated and wherein the Lagrangian method is implicitly integrated.

27. The method of claim 25, wherein the switching comprises projecting the nodes onto the surface of the material.

28. The method of claim 27, further comprising mapping a set of solution variable fields to the material with an Eulerian mapping algorithm.

* * * * *